/ Patent Number: 4,912,520
Date of Patent: Mar. 27, 1990

United States Patent [19]
Yamamoto et al.

[54] MIXER CIRCUIT FOR USE IN A TUNER OF A TELEVISION SET OR THE LIKE

[75] Inventors: Akio Yamamoto; Toshio Nagashima, both of Yokohama, Japan

[73] Assignee: Hitachi, Ltd. (501), Tokyo, Japan

[21] Appl. No.: 203,418

[22] Filed: Jun. 7, 1988

[30] Foreign Application Priority Data

Jun. 11, 1987 [JP] Japan .................. 62-144097

[51] Int. Cl.⁴ .............................. H04B 1/28
[52] U.S. Cl. ..................... 455/333; 307/529
[58] Field of Search .......... 455/333, 319, 318, 190, 455/188, 326; 307/529, 571; 332/43 B

[56] References Cited

U.S. PATENT DOCUMENTS

| | | | |
|---|---|---|---|
| 4,058,771 | 11/1977 | Ohsawa et al. | 455/333 |
| 4,216,431 | 8/1980 | Shibata et al. | 455/333 |
| 4,268,916 | 5/1981 | Kusakabe | 455/333 |
| 4,413,239 | 11/1983 | Romeo et al. | 455/333 |
| 4,461,042 | 7/1984 | Tanabe et al. | 455/333 |
| 4,546,275 | 10/1985 | Pena-Finol et al. | 307/529 |
| 4,633,188 | 12/1986 | Matsuta | 455/188 |
| 4,636,663 | 1/1987 | Jongepier et al. | 307/529 |
| 4,694,204 | 9/1987 | Nishijima et al. | 307/529 |

FOREIGN PATENT DOCUMENTS 0105914  5/1986  Japan .................. 455/333

Primary Examiner—Reinhard J. Eisenzopf
Assistant Examiner—Andrew Faile
Attorney, Agent, or Firm—Kenyon & Kenyon

[57] ABSTRACT

Disclosed is a mixer circuit which employs four FET's in a manner so that a source electrode of a first FET and a source electrode of a second FET are connected to a first terminal, a source electrode of a third FET and a source electrode of a fourth FET are connected to a second terminal, a first impedance circuit is connected between the first terminal and the earth, a second impedance circuit is connected between the second terminal and the earth, a first high frequency input terminal is connected through a first switching circuit to a junction between the first impedance circuit and the first terminal, a second high frequency input terminal is connected through a second switching circuit to a junction between the second impedance circuit and the second terminal, a gate electrode of the first FET and a gate electrode of the fourth FET are connected to a third terminal, a gate electrode of the second FET and a gate electrode of the third FET are connected to a fourth terminal, a drain electrode of the first FET and a drain electrode of the third FET are connected to a fifth terminal, a drain electrode of the second FET and a drain electrode of the fourth FET are connected to a sixth terminal, and an electric source supply circuit is connected to the fifth and sixth terminals. Phase-reversed local oscillation signals are fed to the third and fourth terminals.

18 Claims, 12 Drawing Sheets

MIXER CIRCUIT FOR USE IN A TUNER OF A TELEVISION SET OR THE LIKE

BACKGROUND OF THE INVENTION

The present invention relates to frequency converting mixer circuits for use in tuners of satellite broadcasting receivers, television sets, and the like, and particularly relates to mixer circuits suitable for integrated circuits.

A conventional mixer circuit used in a tuner using an integrated circuit is constituted by a mixer circuit for UHF-band signals, a mixer circuit for VHF-band signals, and a mixer circuit for hyper-band signals, as described in IEEE "Transactions on Consumer Electrons", Vol. CE-32, No. 4, November 1986, pp. 723–732.

FIG. 22 shows the conventional mixer circuit as described in the aforementioned literature. In FIG. 22, a block A surrounded by a broken line represents a double-balanced mixer circuit for receiving a hyper-band signal, a block B surrounded by a broken line represents a buffer amplifier circuit for amplifying the hyper-band signal, a block C surrounded by a broken line represents a double-balanced mixer circuit for receiving a VHF band signal, and a block D surrounded by a broken line represents a buffer amplifier circuit for amplifying the VHF band signal.

In the aforementioned conventional receiver, a plurality of mixer circuits must be provided separately corresponding to the signal bands to be received. Accordingly, the circuits are large in size and as well as in electric power consumption. Further, switching circuits complex in construction must be used for switching the functions of those circuits.

SUMMARY OF THE INVENTION

It is therefore an object of the present invention to provide a balanced type mixer circuit in which two mixers for receiving a UHF band signal and for receiving a VHF band signal are combined to form one small-sized circuit, and in which the coupling between th UHF circuit portion and the VHF circuit portion is so small that the whole circuit is suitably constituted by an integrated circuit.

The mixer circuit according to the invention is constituted by FETs (field effect transistors). According to the present invention, four FETs are used in a manner so that a source electrode of a first FET and a source electrode of a second FET are connected to a first terminal, a source electrode of a third FET and a source electrode of a fourth FET are connected to a second terminal, a first impedance circuit is connected between the first terminal and ground, a second impedance circuit is connected between the second terminal and ground, a first high-frequency input terminal is connected through a first switching circuit to a junction between the first impedance circuit and the first terminal, a second high-frequency input terminal is connected through a second switching circuit to a junction between the second impedance circuit and the second terminal, a gate electrode of the first FET and a gate electrode of the fourth FET are connected to a third terminal, a gate electrode of the second FET and a gate electrode of the third FET are connected to a fourth terminal, a drain electrode of the first FET and a drain electrode of the third FET are connected to a fifth terminal, a drain electrode of the second FET and a drain electrode of the fourth FET are connected to a sixth terminal, and an electric source supply circuit is connected to the fifth and sixth terminals.

According to a first aspect of the invention, phase-reversed local oscillation signals are fed to the third and fourth terminals. Thus, when the first switching circuit is in the ON state, a first-band signal from the first high-frequency input terminal is fed to the first and second FETs which constitute a single-balanced mixer so that intermediate frequency signals having frequencies which are a difference and a sum between the respective frequencies of first-band signal and the local oscillation signal are generated at the fifth and sixth terminals, while when the second switching circuit is in the ON state, a second-band signal from the second high-frequency input terminal is fed to the third and fourth FETs which constitute a single-balanced mixer so that intermediate frequency signals having frequencies which are a difference and a sum between the respective frequencies of the second-band signal and the local oscillation signal are generated at the fifth and sixth terminals.

According to a second aspect of the present invention, phase-reversed local oscillation signals are fed to the third and fourth terminals. Thus, when the first switching circuit is in the ON state, a first-band signal from the first high-frequency input terminal is fed to the four FETs (the first FET to the fourth FET) which constitute a double-balanced mixer, so that intermediate frequency signals having frequencies which are a difference and a sum between the respective frequencies of first-band signal and the local oscillation signal are generated at the fifth and sixth terminals, while when the second switching circuit is in the ON state, a second-band signal from the second high-frequency input terminal is fed to the four FETs which constitute a double-balanced mixer, so that intermediate frequency signals having frequencies which are a difference and a sum between the respective frequencies of the second-band signal and the local oscillation signal are generated at the fifth and sixth terminals.

BRIEF DESCRIPTION OF THE DRAWINGS

Other features and advantages of the present invention will be apparent from the following description taken in connection with the accompanying drawings, wherein.

DETAILED DESCRIPTION OF THE PRESENT INVENTION

Preferred embodiments of the present invention will be described hereunder with reference to the drawings.

Figure 1:
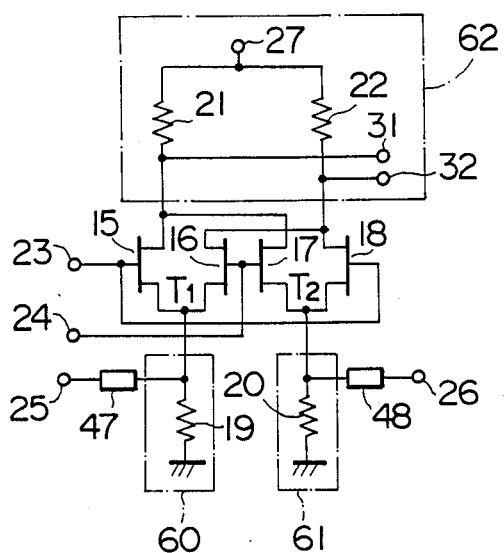
FIG. 1 is a circuit diagram showing a first embodiment of the mixer circuit according to the present invention.

FIG. 1 is a circuit diagram showing an embodiment according to the present invention. The circuit is constituted by FETs (field-effect transistors) 15, 16, 17 and 18, resistors 19, 20, 21 and 22, input terminals 23 and 24 for local oscillation signals, input terminals 25 and 26 for signals of respective frequency bands, an electric source terminal 27, output terminals 31 and 32 for intermediate frequency signals, switching circuits 47 and 48, impedance circuits 60 and 61, a connection terminal T1 for connecting the source of the FET 15 to the source of the FET 16, and a connection terminal T2 for connecting the source of the FET 17 to the source of the FET 18.

Figure 1A:
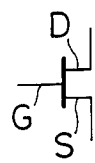
FIG. 1A is a view showing the names of electrodes of an FET.

As shown in FIG. 1A, each of the FETs has a gate electrode G, a drain electrode D and a source electrode S.

In FIG. 1, the FETs 15 and 16 constitute a first single-balanced mixer and the FETs 17 and 18 constitute a second single-balanced mixer, so that the circuit has two single-balanced mixers.

When the switching circuits 47 and 48 are in the ON state and OFF state respectively, a signal of a band-I (VHF band, MID band, superband or hyper-band) is received through the terminal 25. When, contrariwise, the switching circuits 47 and 48 are in the OFF state and ON state respectively, a signal of a band-II (UHF band) is received through the terminal 26. Local oscillation signals having phases reversed to each other are always supplied to the terminals 23 and 24. In the case where the switching circuit 47 is in the ON state, the band-I signal received through the terminal 25 is mixed with the local oscillation signals in the FETs 15 and 16 to generate mutually reversed-phase intermediate frequency signals from the terminals 31 and 32 respectively. In this case, the FETs 15 and 16 serve as a single-balanced mixer.

In the case where the switching circuit 48 is in the ON state, the band-II signal received through the terminal 26 is mixed with the local oscillation signals in the FETs 17 and 18 to generate mutually reversed-phase intermediate frequency signals at the terminals 31 and 32 respectively. In this case, the FETs 17 and 18 serve as a single-balanced mixer.

The circuit of FIG. 1 has a feature in that signals of different bands are received through the two source input terminals 25 and 26 so that intermediate frequency signals are generated by two single-balanced mixers. Thus, the isolation between the mixers of the two bands I and II is good. Because the input terminals for the two bands I and II are provided separately, the switching circuits are simple in construction. Because the circuit according to the present invention is constituted by FETs and resistors, the circuit can be suitably realized in the form of an integrated circuit.

Figure 2:
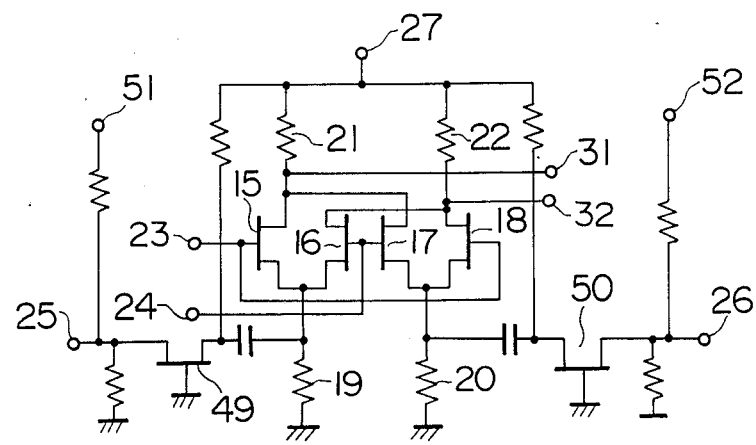
FIGS. 2 through 21 are circuit diagrams showing other embodiments according to the present invention.

FIG. 2 is a circuit diagram showing a second embodiment of the mixer circuit according to the present invention, in which switching circuits corresponding to the switching circuits 47 and 48 of FIG. 1 are illustrated specifically.

FETs 49 and 50 are used to constitute the switching circuits corresponding to the switching circuits 47 and 48. Switching voltages are applied to the source electrodes of the FETs 49 and 50 through resistors respectively. For example, if high-level and low-level switching voltages are applied to the terminals 51 and 52, the FETs 49 and 50 are made to be in the OFF and ON states respectively, so that a band-II signal is fed to the FETs 17 and 18 through the terminal 26. For example, if low-level and high-level switching voltages are provided to the terminals 51 and 52, the FETs 50 and 49 are operated to be in the OFF and ON states respectively, so that a band-I signal is fed to the FETs 15 and 16 through the terminal 25.

Figure 3:
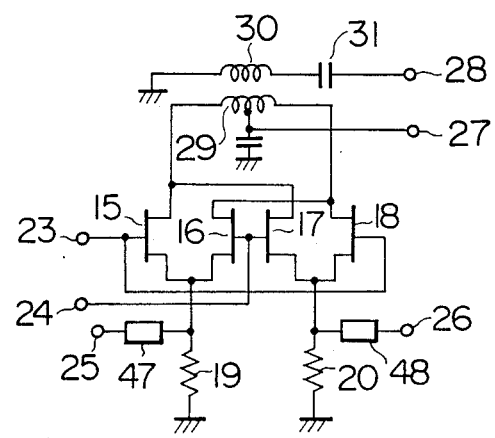

FIG. 3 is a circuit diagram showing a third embodiment of the mixer circuit according to the present invention, in which an intermediate frequency output signal is produced at a terminal 28 through an induction coupler constituted by an inductor 30 and another inductor 29 which is electrically connected to the drain electrodes of the FETs 15, 16, 17 and 18. The inductor 30 and a capacitor 31 constitute an intermediate frequency filter.

Figure 4:
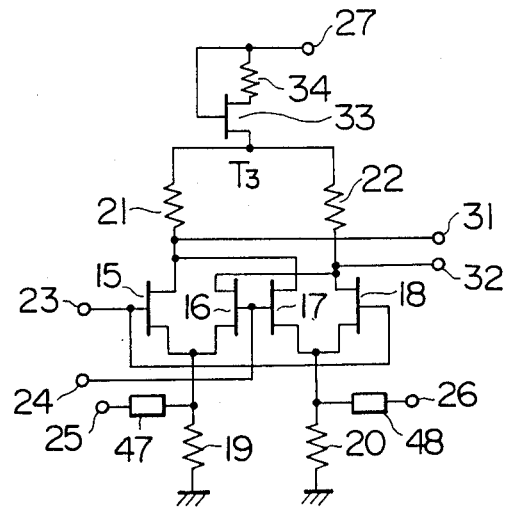
Figure 5:
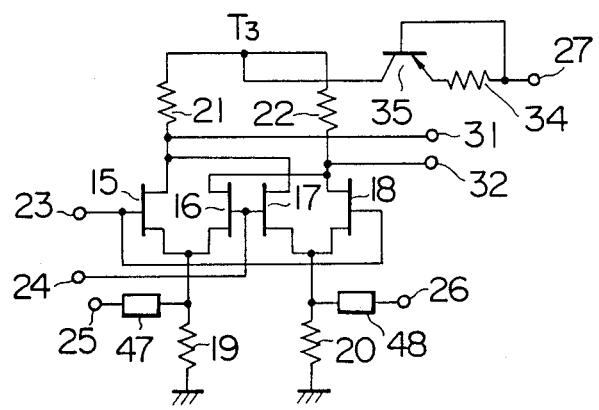
Figure 6:
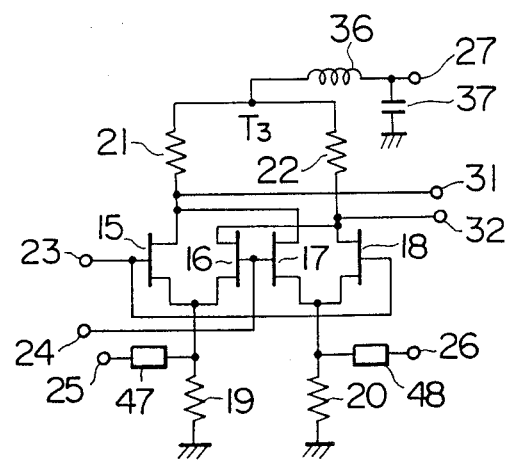

FIGS. 4 through 6 are circuit diagrams showing other embodiments of the mixer circuit according to the present invention.

In the embodiment shown in FIG. 4, a high-impedance constant-current circuit constituted by a P-channel FET 33 and a resistor 34 is electrically connected between an electric source terminal 27 and a junction T3 between resistors 21 and 22.

In the embodiment shown in FIG. 5, a high-impedance constant-current circuit constituted by a PNP transistor 35 and a resistor 34 is electrically connected between an electric source terminal 27 and a junction T3 between resistors 21 and 22.

In the embodiment shown in FIG. 6, a high-impedance circuit constituted by a choke coil 36 of high impedance within a range of from about 50 to about 100 $\mu$H (henry) and a capacitor 37 is electrically connected between an electric source terminal 27 and a junction T3 between resistors 21 and 22 so that a constant current flows in the high-impedance circuit.

The respective embodiments of FIGS. 4 through 6 are different from the respective embodiments of FIGS. 1 through 3 in that, in the embodiments of FIGS. 4 through 6, a constant current is supplied to the terminal (junction) T3 from the electric source terminal 27. Therefore, the operation of the mixer circuit in each of FIGS. 4 through 6 is different from the operation of the mixer circuit in each of FIGS. 1 through 3.

Because the constant-current circuit is electrically connected between the electric source terminal 27 and the terminal T3, the FETs 15 through 18 serve as a double-balanced mixer, so that the input signal supplied through the terminal 25 or 26 is converted into balanced signals.

The input signal supplied through the terminal 25 is fed to the source electrodes of the FETs 15 and 16 to thereby change the drain current of the FETs 15 and 16. For example, if the input voltage of the terminal 25 increases, the drain current of the FETs 15 and 16 decreases. Because the high-impedance constant-current circuit is electrically connected to the drain electrodes of the FETs 15, 16, 17 and 18, the drain current flowing in the FETs 17 and 18 increases as the drain current of the FETs 15 and 16 decreases. In short, a current having a phase reversed to that of the high-frequency current flowing in the FETs 15 and 16 flows in the FETs 17 and 18, so that the unbalanced input high-frequency signals are converted into balanced output signals which are put out from the terminals 31 and 32.

With respect to the band-II signal received through the terminal 26, the same operation as described above is carried out. The unbalanced input signals are converted into balanced output signals by the mixer circuit which serves as a double-balanced mixer. Therefore, intermediate frequency signals which are stable against distortion can be provided by the mixer circuit.

Figure 7:
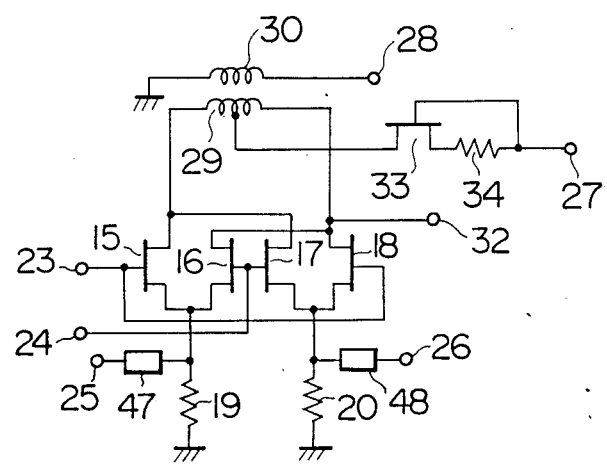
Figure 8:
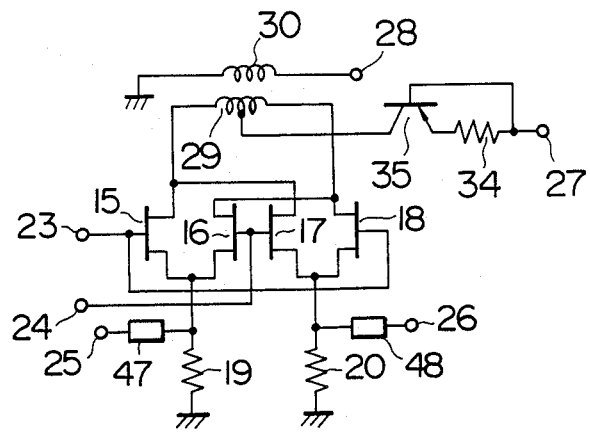
Figure 9:
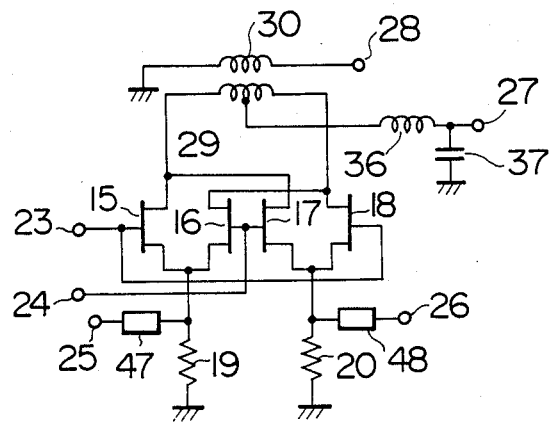

FIGS. 7 through 9 are circuit diagrams respectively illustrating further embodiments of the mixer circuit according to the invention.

In the embodiments shown in FIGS. 7 through 9, a high-impedance constant-current circuit is connected to the coil 29 in the embodiment of FIG. 3.

The respective mixer circuits shown in FIGS. 7 through 9 have the function in the mixer circuit shown in FIG. 3 as well as the function in the mixer circuit shown in FIGS. 4 through 6.

Figure 10:
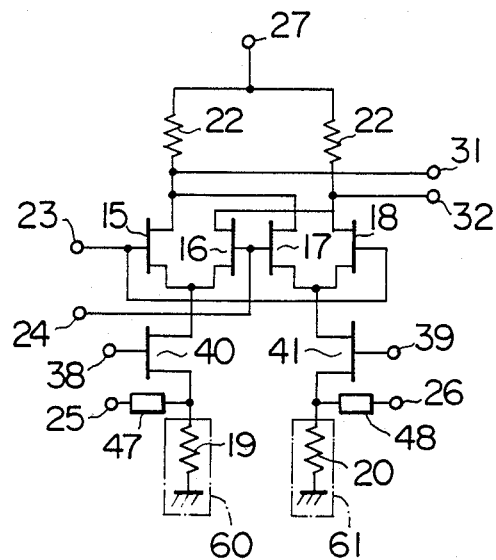

FIG. 10 is a circuit diagram showing a still further embodiment of the mixer circuit according to the present invention. The mixer circuit of FIG. 10 is similar to that of FIG. 1, except that buffer circuits constituted by FETs 40 and 41 are electrically connected to the source electrodes of the FEs 15, 16, 17 and 18.

This embodiment provides stabilization of input impedance, improvement of conversion gain, and suppression of local oscillation signal leakage.

Figure 11:
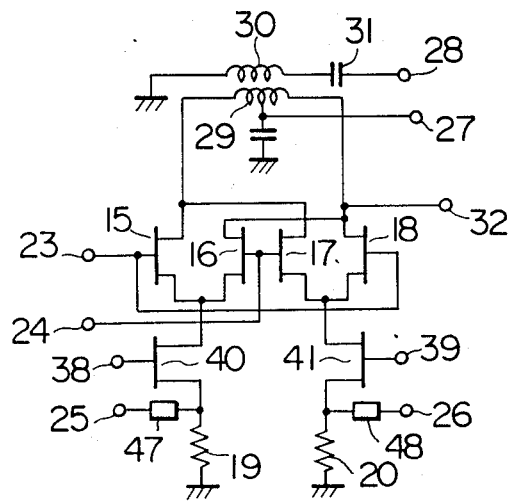
Figure 12:
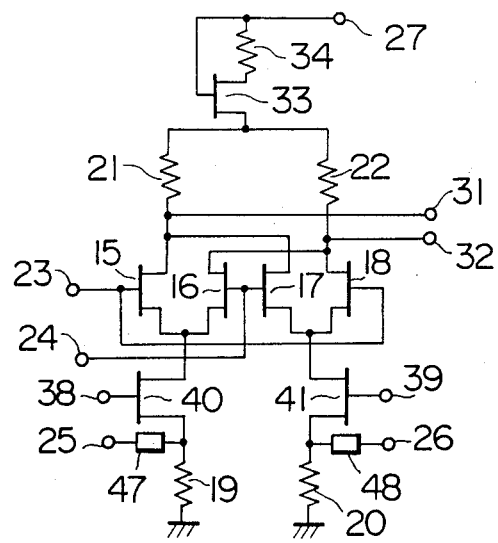
Figure 13:
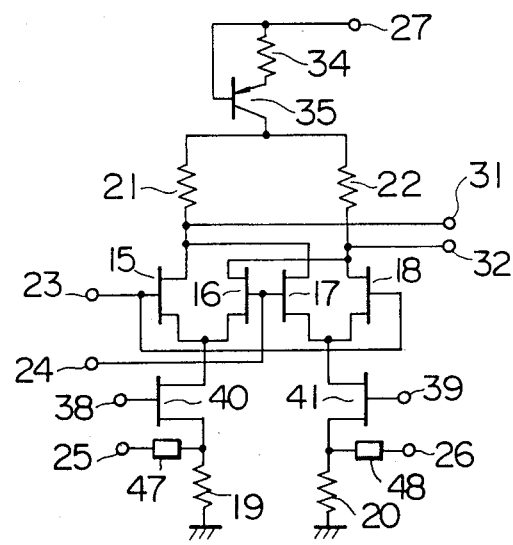
Figure 14:
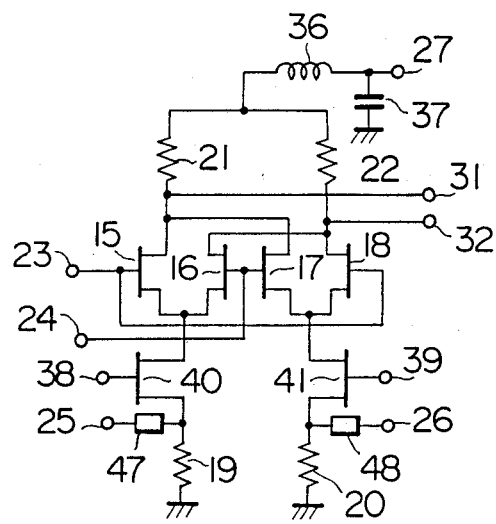
Figure 15:
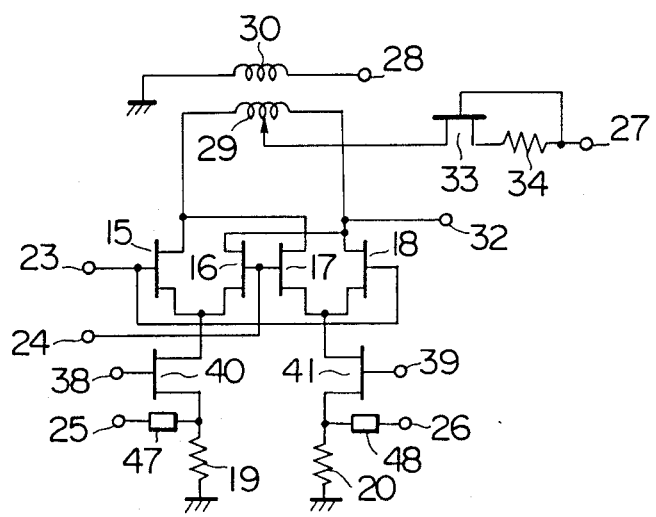
Figure 16:
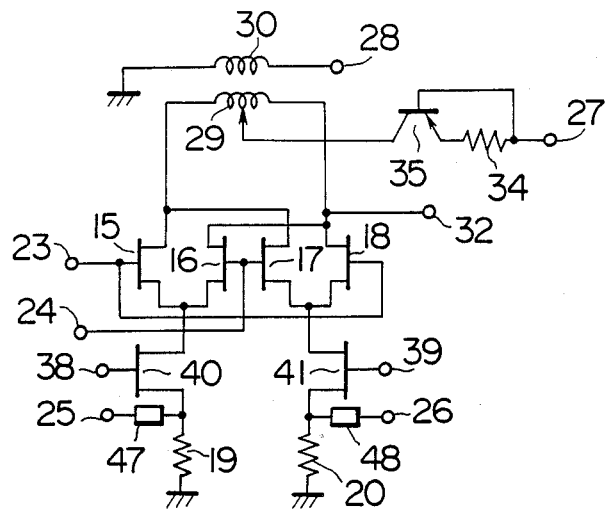
Figure 17:
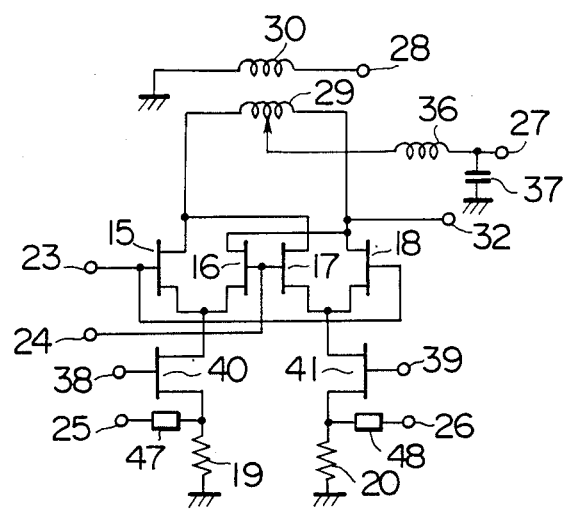

The embodiment of FIG. 11 is similar to that of FIG. 3, except that buffer circuits constituted by FETs 40 and 41 are connected to the source electrodes of the FETs 15, 16, 17 and 18.

The embodiments of FIGS. 12 through 17 correspond to those of FIGS. 4 through 9, respectively. In each of the embodiments of FIGS. 12 through 17, buffer circuits constituted by FETs 40 and 41 are electrically connected to the source electrodes of the FETs 15 16, 17 and 18.

Although the aforementioned embodiments have shown the case there a high-frequency input signal is fed to the source electrodes of the FETs, the following embodiments will show the case where a high-frequency input signal is fed to the gate electrodes of the FETs.

Figure 18:
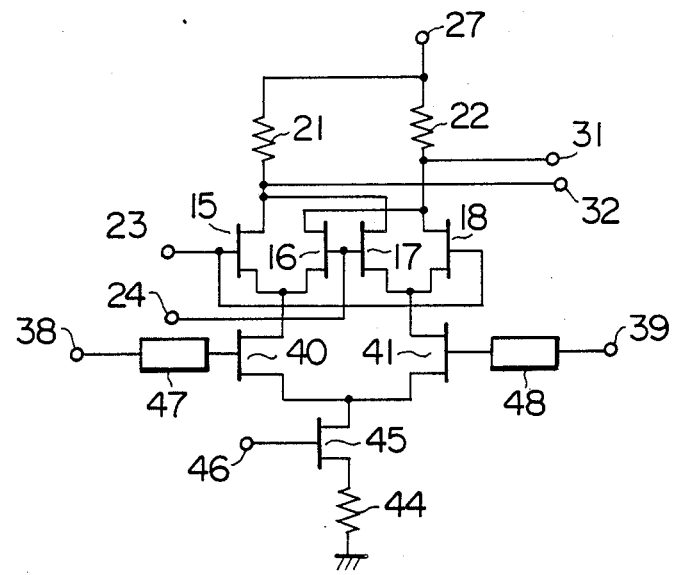

FIG. 18 shows an embodiment in which a high-frequency input signal is fed to the gate electrodes. Through switching circuits 47 and 48, signals of the band-I and band-II are fed to the gate electrodes of the FETs 40 and 41 constituting buffer amplifier circuits, so that a balanced mixer circuit is constituted. An FET 45 and a resistor 44 constituting a constant-current source are connected to the source electrodes of the FETs 40 and 41 which constitute buffer amplifier circuits, so that unbalanced input signals supplied through the signal input terminals 38 and 39 are converted into balanced output signals which are produced at the terminals 31 and 32. A bias voltage is applied to the terminal 46.

If a band-I signal is received through the terminal 38, the terminal 39 is short-circuited with respect to a high-frequency by the switching circuit 48. If a band-II signal is received through the terminal 39, on the contrary, the terminal 39 is grounded with respect to a high frequency by the switching circuit 47. According to this embodiment, the unbalanced input signals re converted into balanced output signals, so that intermediate frequency signals which are stable against distortion can be attained.

Figure 19:
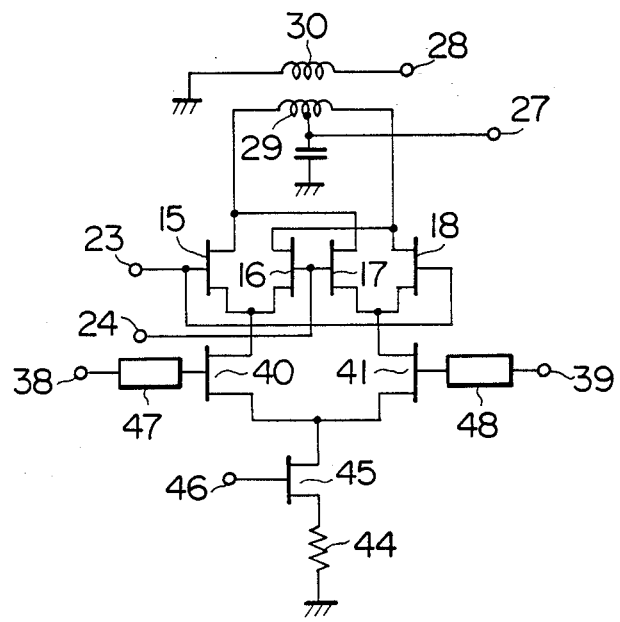

In the embodiment shown in FIG. 19, an intermediate frequency signal is put out from the terminal 28 through inductors 29 and 30.

Figure 20:
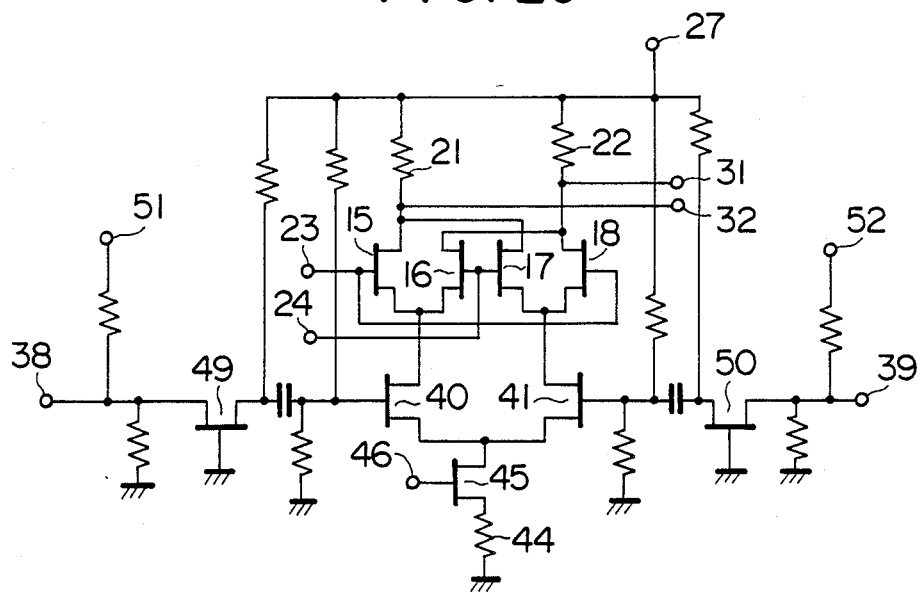

In the embodiment shown in FIG. 20, switching transistors 49 and 50 are connected to the gate electrodes of the FETs 40 and 41 each of which constitutes a buffer amplifier circuit. If a band-I signal is received through the terminal 38, a high-level voltage is applied to the terminal 52 to set the OFF state of the FET 50. If a band-II signal is received through the terminal 39, on the other hand, a high-level voltage is applied to the terminal 51 to set the OFF state of the FET 49. Also in this embodiment, input impedance can be stabilized so that intermediate frequency signals which are stable against distortion can be attained.

Figure 21:
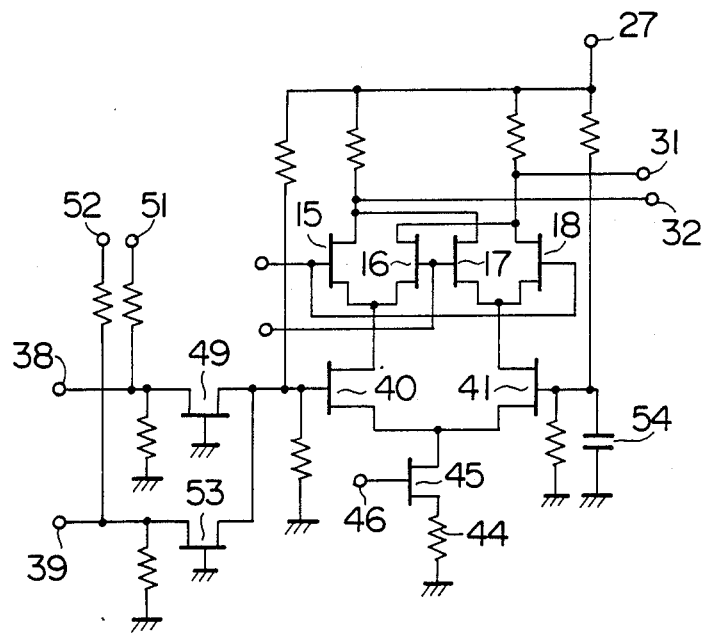
Figure 22:
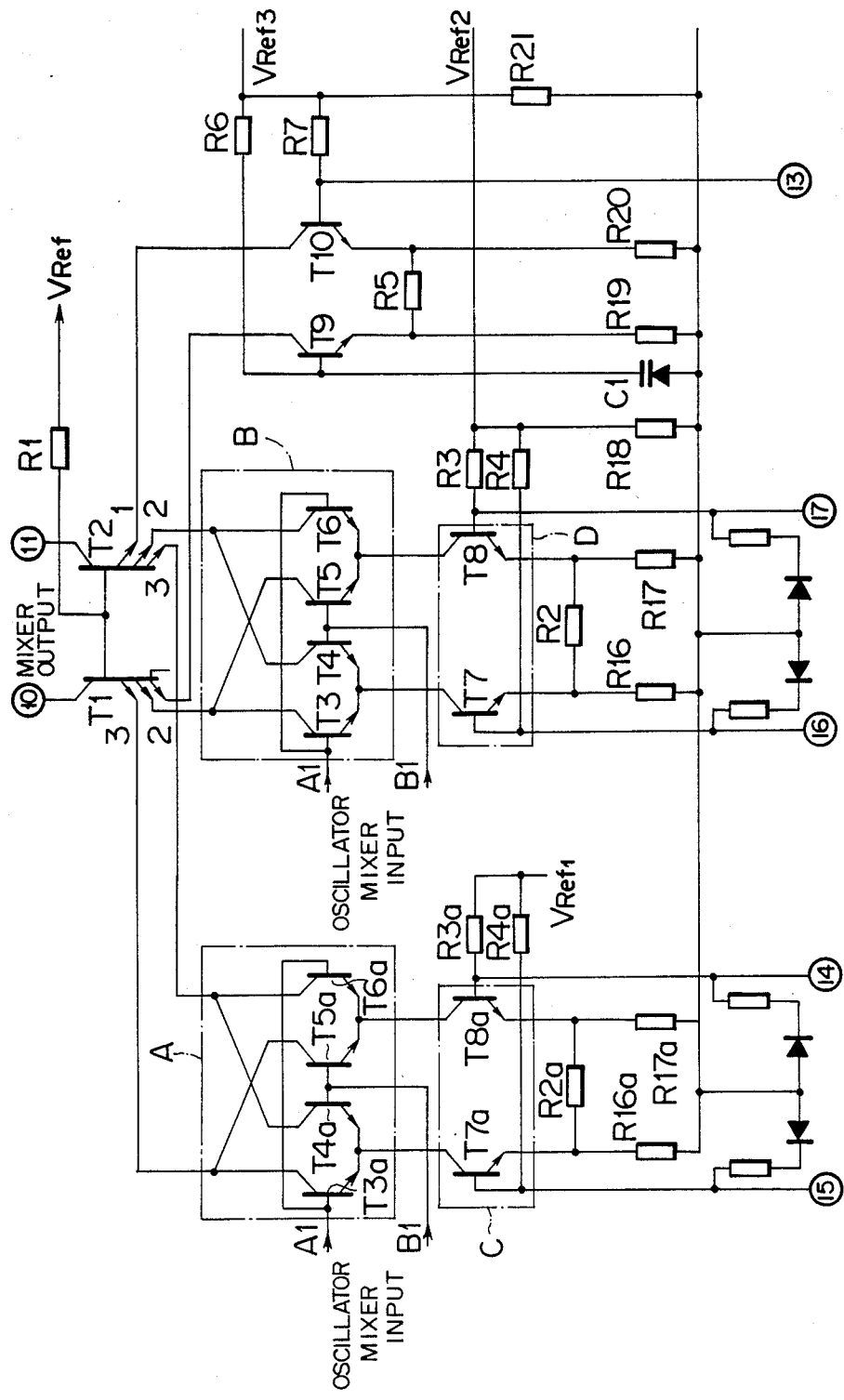
FIG. 22 is a circuit diagram showing a conventional mixer circuit.

In the embodiment shown in FIG. 21, switching transistors 49 and 53 are connected to the gate electrode of the FET 40 as buffer amplifier circuits. The gate electrode of the FET 41 is grounded through a capacitor 54. The operation of the circuit shown in FIG. 21 is similar to that of FIG. 20. The input signals supplied through the terminals 38 and 39 are switched by the switching transistors 49 and 53. Also in this embodiment, unbalanced input signals are converted into balanced signals so that intermediate frequency signals which are stable against distortion can be attained. Because the gate electrode of the FET 41 is always grounded with respect to a high frequency, the conversion gain is improved and the input impedance is stabilized.

According to the present invention, a balanced mixer suitable for a tuner mixer circuit can be provided. For example, the mixer circuit according to the invention is constituted by a mixer for receiving UHF band signal and a mixer for receiving VHF band signal which are integrated with each other so that the coupling between the UHF circuit and the VHF circuit is small, and the mixer circuit can be suitably realized in the form of an integrated circuit.

We claim:

1. A mixer circuit for use in tuners for television sets, comprising:
    (a) a pair of first and second FETs with their respective source electrodes electrically connected to each other;
    (b) a pair of third and fourth FETs with their respective source electrodes electrically connected to each other,
    a gate electrode of said third FET being electrically connected to a gate electrode of said second FET,
    a drain electrode of said third FET being electrically connected to a drain electrode of said first FET,
    a gate electrode of said fourth FET being electrically connected to a gate electrode of said first FET,
    a drain electrode of said fourth FET being electrically connected to a drain electrode of said second FET;
    (c) a first impedance circuit electrically connected to said source electrode of said first FET;
    (d) a second impedance circuit electrically connected to said source electrode of said third FET;
    (e) a third impedance circuit electrically connected between said drain electrode of said first FET and an electric source;
    (f) a fourth impedance circuit electrically connected between said drain electrode of said fourth FET and said electric source;
    (g) a pair of first and second input terminals to which local oscillation signals having phases reversed to each other are supplied,
    said first input terminal being electrically connected to said gate electrode of said first FET,
    said second input terminal being electrically connected to said gate electrode of said third FET;
    (h) a third input terminal to which a first signal in a first frequency band is supplied;
    (i) a fourth input terminal to which a second signal in a second frequency band different from said first frequency band is supplied;
    (j) a first switching circuit electrically connected between said third input terminal and said source electrode of said first FET and arranged to be selectively opened and closed; and (k) a second switching circuit electrically connected between said fourth input terminal and said source electrode of said third FET and arranged to be selectively opened and closed alternatively with said first switching circuit.

2. A mixer circuit according to claim 1, in which said first and second switching circuits are constituted by fifth and sixth FETs with their gate electrodes grounded, respectively.

3. A mixer circuit according to claim 1, in which said third and fourth impedance circuits are constituted by first and second inductors.

4. A mixer circuit according to claim 3, in which said first inductor is electrically connected to an intermediate frequency filter.

5. A mixer circuit according to claim 1, in which said third and fourth impedance circuits are electrically connected to said electric source through a constant-current circuit.

6. A mixer circuit according to claim 1, in which said third and fourth impedance circuits are electrically connected to said electric source through a choke coil.

7. A mixer circuit according to claim 3, in which said first inductor is electrically connected to said electric source through a constant-current circuit.

8. A mixer circuit according to claim 3, in which said first inductor is electrically connected to a choke coil.

9. A mixer circuit according to claim 1, in which a first buffer circuit constituted by a fifth FET is electrically connected between said source electrode of said first FET and said first impedance circuit, and in which a second buffer circuit constituted by a sixth FET is electrically connected between said source electrode of said third FET and said second impedance circuit.

10. A mixer circuit according to claim 4, in which a first buffer circuit constituted by a fifth FET is electrically connected between said source electrode of said first FET and said first impedance circuit, and in which a second buffer circuit constituted by a sixth FET is electrically connected between said source electrode of said third FET and said second impedance circuit.

11. A mixer circuit according to claim 5, in which a first buffer circuit constituted by a fifth FET is electrically connected between said source electrode of said first FET and said first impedance circuit, and in which a second buffer circuit constituted by a sixth FET is electrically connected between said source electrode of said third FET and said second impedance circuit.

12. A mixer circuit according to claim 6, in which a first buffer circuit constituted by a fifth FET is electrically connected between said source electrode of said first FET and said first impedance circuit, and in which as second buffer circuit constituted by a sixth FET is electrically connected between said source electrode of said third FET and said second impedance circuit.

13. A mixer circuit according to claim 7, in which a first buffer circuit constituted by a fifth FET is electrically connected between said source electrode of said first FET and said first impedance circuit, and in which a second buffer circuit constituted by a sixth FET is electrically connected between said source electrode of said third FET and said second impedance circuit.

14. A mixer circuit according to claim 8, in which a first buffer circuit constituted by a fifth FET is electrically connected between said source electrode of said first FET and said first impedance circuit, and in which a second buffer circuit constituted by a sixth FET is electrically connected between said source electrode of said third FET and said second impedance circuit.

15. A mixer circuit for use in tuners for television sets, comprising:

(a) a pair of first and second FETs with their respective source electrodes electrically connected to each other;

(b) a pair of third and fourth FETs with their respective source electrodes electrically connected to each other, a gate electrode of said third FET being electrically connected to a gate electrode of said second FET, a drain electrode of said third FET being electrically connected to a drain electrode of said first FET, a gate electrode of said fourth FET being electrically connected to a gate electrode of said first FET, a drain electrode of said fourth FET being electrically connected to a drain electrode of said second FET;

(c) a pair of fifth and sixth FETs with their source electrodes electrically connected to each other, a drain electrode of said fifth FET being electrically connected to said source electrode of said first FET, a drain electrode of said sixth FET being electrically connected to said source electrode of said third FET;

(d) a first constant-current circuit including a seventh FET an being electrically connected to said source electrode of said fifth FET;

(e) a first impedance circuit electrically connected between said drain electrode of said first FET and an electric source;

(f) a second impedance circuit electrically connected between said drain electrode of said fourth FET and said electric source;

(g) a pair of first and second input terminals to which local oscillation signals having phases reversed to each other ar supplied, said first input terminal being electrically connected to said gate electrode of said first FET, said second input terminal being electrically connected to said gate electrode of said third FET;

(h) a third input terminal to which a first signal in a first frequency ban is supplied;

(i) a fourth input terminal to which a second signal in a second frequency band different from said first frequency band is supplied;

(j) first switching circuit electrically connected between said third input terminal and a gate electrode of said fifth FET and arranged to be selectively opened and closed; and (k) a second switching circuit electrically connected between said fourth input terminal and a gate electrode of said sixth FET and arranged to be selectively opened and closed alternatively with said first switching circuit.

16. A mixer circuit according to claim 15, in which said first and second switching circuits are constituted by eighth and ninth FETs with their gate electrodes grounded, respectively.

17. A mixer circuit according to claim 15, in which said first and second impedance circuits are constituted by inductors, respectively.

18. A mixer circuit for use in tuners for television sets, comprising:

(a) a pair of first and second FETs with their respective source electrodes electrically connected to each other;
(b) a pair of third and fourth FETs with their respective source electrodes electrically connected to each other,
a gate electrode of said third FET being electrically connected o a gate electrode of said second FET,
a drain electrode of said third FET being electrically connected to a drain electrode of said first FET,
a gate electrode of said fourth FET being electrically connected to a gate electrode of said first FET,
a drain electrode of said fourth FET being electrically connected to a drain electrode of said second FET;
(c) pair of fifth and sixth FETs with their source electrodes electrically connected to each other,
a drain electrode of said fifth FET being electrically connected to said source electrode of said first FET,
a drain electrode of said sixth FET being electrically connected to said source electrode of said third FET;
(d) a first constant-current circuit including a seventh FET and being electrically connected to said source electrode of said fifth FET;
(e) a first impedance circuit electrically connected between said drain electrode of said first FET and an electric source;
(f) a second impedance circuit electrically connected between said drain electrode of said fourth FET and said electric source;
(g) a pair of first and second input terminals to which local oscillation signals having phases reversed to each other are supplied,
said first input terminal being electrically connected to said gate electrode o said first FET,
said second input terminal being electrically connected to said gate electrode of said third FET;
(h) a third input terminal to which a first signal in a first frequency band is suppied;
(i) a fourth input terminal to which a second signal in a second frequency band different from said first frequency band is supplied;
(j) a first switching circuit electrically connected between said third input terminal and a gate electrode of said fifth FET and arranged to be selectively opened and closed; and
(k) a second switching circuit electrically connected between said fourth input terminal and gate electrode of said fifth FET an arranged to be selectively opened and closed alternatively with said first switching circuit.

* * * * *